United States Patent
Mizukoshi

[11] 4,008,440
[45] Feb. 15, 1977

[54] AMPLITUDE-LIMITER

[75] Inventor: Shigeyuki Mizukoshi, Tokyo, Japan

[73] Assignee: Iwasaki Tsushinki Kabushiki Kaisha, Japan

[22] Filed: May 22, 1975

[21] Appl. No.: 579,936

[30] Foreign Application Priority Data

May 25, 1974 Japan .............................. 49-58955

[52] U.S. Cl. .......................... 328/171; 307/235 K; 307/237; 328/175
[51] Int. Cl.² ...................... H03K 5/08; H03B 3/02
[58] Field of Search ............... 307/230, 235 K, 237, 307/290; 328/169, 171, 172, 175; 330/110

[56] References Cited
UNITED STATES PATENTS

| 3,666,970 | 5/1972 | Abbott et al. | 307/235 K |
| 3,743,950 | 7/1973 | Sellari, Jr. et al. | 307/235 K |

*Primary Examiner*—John Zazworsky
*Attorney, Agent, or Firm*—Robert E. Burns; Emmanuel J. Lobato; Bruce L. Adams

[57] ABSTRACT

An amplitude limiter, in which an input AC signal is applied to a first input of a differential amplifier and the output of the differential amplifier is positively fed back to a second input of the differential amplifier, so that an amplitude-limited output signal is derived from an output circuit coupled to the output terminal of the differential amplifier. A first diode is inserted in a line commonly connected to the feedback circuit and the output circuit of the differential amplifier to produce a positive periodic wave which is half-wave rectified from said input AC signal. A bias voltage set circuit is connected to the second input terminal of the differential amplifier to apply thereto a negative bias voltage to determine the negative limited level of the output of the differential amplifier. A second diode may be provided in the bias voltage set circuit in the direction of the bias current. The first rectifier element and the second rectifier element may have substantially the same temperature characteristics.

3 Claims, 7 Drawing Figures

AMPLITUDE-LIMITER

This invention relates to a limiter for limiting the amplitude of an alternating signal to a predetermined level.

An object of this invention is to provide a limiter which is capable of maintaining the duty ratio of the amplitude limited output alternating current signal to be constant irrespective of lowering of the level of an input alternating current signal.

The principle, construction and operation of this invention will be clearly understood from the following detailed description taken in conjunction with the accompanying drawings, in which.

Figure 1:
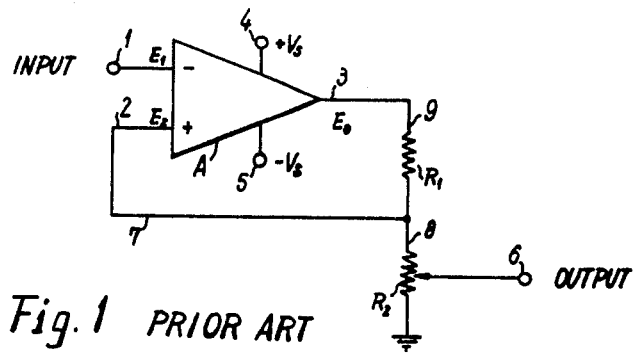
FIG. 1 is a circuit diagram illustrating a conventional limiter.

For readily understanding the principle of this invention, a conventional limiter will first be described with reference to FIG. 1. In FIG. 1, reference character A indicates a differential amplifier, which is provided with a first input terminal 1 to be supplied with an input alternating current signal $E_1$, a second input terminal 2 to be supplied with a voltage $E_2$, an output terminal 3 for deriving therefrom a limited output voltage, a positive power source terminal 4 for the impression therethrough of a power source voltage $+V_S$ and a negative power source terminal 5 for the impression therethrough of a negative power source voltage $-V_S$. Namely, the abovesaid amplifier A is an operational amplifier. Reference characters $R_1$ and $R_2$ denote resistors for dividing an output voltage $E_0$ of the amplifier A to positively feed back the voltage $E_2$ to the second input terminal 2. The resistor $R_2$ has an output lead-out terminal 6. Reference numeral 7 identifies a feedback line; 8 designates an output line; and 9 represents a line common to the feedback line 7 and the output terminal 6.

Figure 2A:
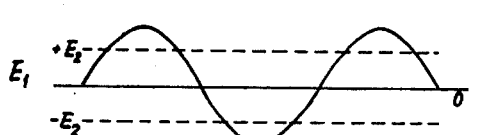
FIGS. 2A and 2B are waveform diagrams explanatory of the operation of the limiter shown in FIG. 1.
Figure 2B:
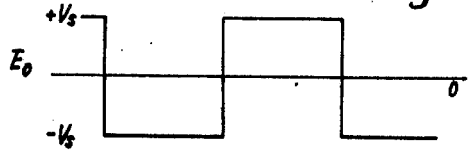

In the limiter of such a construction as described above, when an AC voltage $E_1$ such as depicted in FIG. 2A is applied to the input terminal 1, there is derived from the output terminal 3 such a limited output voltage $E_0$ as shown in FIG. 2B which is limited in amplitude and reshaped in waveform. This will hereinbelow be described in detail. Assuming that such an AC input voltage $E_1$ as depicted in FIG. 2A is applied to the first input terminal 1 and that it assumes negative value, a positive output voltage is produced at the output terminal 3. This output voltage is divided by the resistors $R_1$ and $R_2$ and positively fed back to the second input terminal 2. Since the gain of the amplifier A is very high (for example, +100dB), the amplifier A sharply saturates so that the output voltage $E_0$ assumes a voltage close to the positive power source voltage $+V_S$ and is limited in amplitude at a level determined in accordance with the positive power source voltage $+V_S$. Next, when the input voltage $E_1$ becomes positive, the contrary operation is achieved. Namely, the output voltage $E_0$ sharply becomes a voltage close to the negative power source voltage $-V_S$ and is limited in amplitude at a level determined in accordance with the negative power source voltage $-V_S$. Accordingly, such a rectangular output as illustrated in FIG. 2B is obtained from the output terminal 3. In this case, if the amplitude of the input voltage $E_1$ is sufficiently larger than a feedback voltage $E_2$ which is set by dividing the output voltage $E_0$, the duty ratio of 50% is obtained. Generally, since the input voltage $E_1$ is selected to be sufficiently higher than the feedback voltage $E_2$, the duty ratio of 50% provides an ideal rectangular output. However, in a case where the input voltage $E_1$ level becomes low and approaches the feedback voltage $E_2$ in this circuit, the rise and the fall portions of the output signal become gentle so that the duty ratio of the output rectangular wave decrease less than 50%, resulting in dispersion in the duty ratio. Namely, as indicated by a solid line curve $a$ in FIG. 4, when the input voltage $E_1$ approaches the feedback voltage $E_2$, the duty ratio lowers. Such a change in the duty ratio causes a change in the fundamental wave component of the output signal, and hence is not desirable.

In accordance with this invention, the duty ratio of the output signal can be maintained constant irrespective of lowering of the input signal level.

This invention will hereinafter be described in detail. The first example of this invention comprises: a differential amplifier, for example, an IC operational amplifier, having at least a first input terminal, a second input terminal, an output terminal for providing an output representative of the difference between voltages respectively applied to the first and second input terminals, a positive power source terminal and a negative power source terminal; a feedback circuit connected so that the output voltage derived from the output terminal of the differential amplifier can be positively fed back to the second input terminal; a rectifier element, for example, a diode, inserted in a line commonly connected to the feedback circuit and the output circuit, that is, before a branch point of the feedback circuit; and a bias voltage set circuit connected to the second input terminal to apply a negative bias voltage thereto, and in which an input signal is applied to the first input terminal to derive an amplitude limited output from the output circuit. In the limiter of such a construction, the rectifier element permits the passage therethrough of only half an amplitude or an amplitude of selected magnitude of the output rectangular wave by adjustment of the negative bias voltage by the bias voltage set circuit, so that gentle rise and fall portions of the output rectangular wave can be prevented from passing through the rectifier element. Consequently, it is possible that an input AC signal included in a wide level range is converted into a rectangular output having a constant duty ratio of, for example, 50%.

The second example of this invention further comprises another rectifier element having substantially the same temperature characteristic as the former rectifier element inserted in the aforesaid common line and which is connected to the bias voltage set circuit. Under such a construction, a rectangular output having a constant duty ratio can be obtained over a wide level range of the input AC signal as in the case of the first embodiment of the invention and, at the same time, the threshold level of the limiter does not fluctuate over a wide temperature range, and consequently an output rectangular wave of constant level can be obtained.

Next, actual embodiments of this invention will be clearly described with reference to the drawings.

Figure 3:
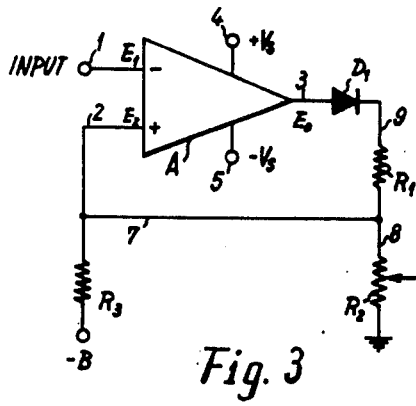
FIG. 3 is a circuit diagram illustrating an example of this invention.
Figure 4:
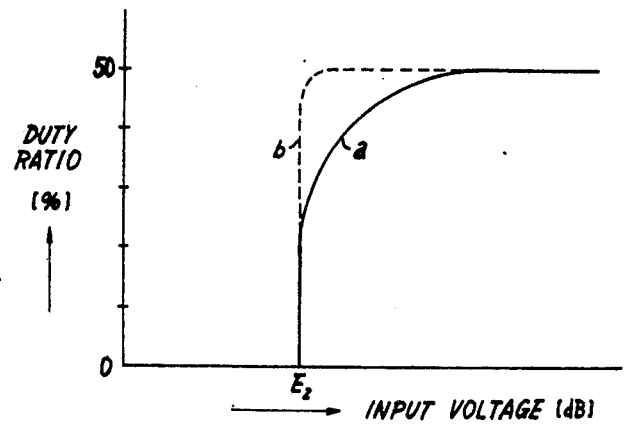
FIG. 4 shows characteristic curves illustrating the relationship between an input voltage and the duty ratio of a limited output signal in the example shown in FIG. 3.

Referring first to FIGS. 3 and 4, the first embodiment will be described. In FIG. 3, parts corresponding to those in FIG. 1 are identified by the same reference numerals and characters so that no description will be repeated. In the limiter of the present embodiment, a diode $D_1$ is connected in a forward direction in a common line 9 between the output terminal 3 and the resistor $R_1$. Further, a bias voltage set circuit composed of a resistor $R_3$ and a negative bias source terminal $-B$ is connected to the second input terminal 2 to apply a negative bias voltage thereto to determine the negative limited level of the output signal.

In the circuit constructed as described above, when the negative portion of an AC signal is applied to the first input terminal 1, a positive output voltage is obtained at the output terminal 3 and is positively fed back to the second input terminal 2 through the diode $D_1$, the resistor $R_1$ and the feedback line. The output voltage $E_0$ sharply rises and is amplitude-limited at a voltage level close to the positive power source voltage $+V_s$. On the other hand, when the AC input signal becomes positive, since a negative bias voltage is applied to the second input terminal 2 from the negative bias source terminal $-B$, the output voltage $E_0$ derived from the output terminal 3 becomes a negative output voltage. Consequently, at the output terminal 3, there is obtained an output signal similar to that obtainable from the limiter shown in FIG. 1. In this limiter, however, only those level periods whose potentials are higher than the cathode potential of the diode $D_1$ set by the negative voltage of the bias source terminal $-B$ pass through the diode $D_1$ and are derived from the output lead-out terminal 6 and, at the same time, positively fed back to the second input terminal 2. Consequently, only sharp rise and fall portions which substantially correspond to the center portions in amplitude of the output voltage $E_0$ passes through the diode $D_1$, eliminating gentle rise and fall portions which have been produced in the conventional limiter output when the input signal has a low level. In the period in which the output voltage $E_0$ is cut off by the diode $D_1$, a negative voltage which is dependent upon the negative bias voltage supplied to the bias source terminal $-B$ is derived from the output terminal 6 and, at the same time, applied to the second input terminal 2 as described above. Consequently, a rectangular output having a duty ratio of 50%, which has positive and negative portions, is derived from the output terminal 6.

As is evident from the foregoing, even if the input signal voltage $E_1$ becomes a low level close to the feedback voltage $E_2$ so as to make the rise and fall portions of the output voltage $E_0$ gentle in the conventional limiter, it is possible in this limiter to eliminate the gentle rise and fall portions by the diode $D_1$ and the bias voltage set circuit to obtain an output having only sharp rise and fall portions which have the duty ratio of 50%. As a result of this, a limiter characteristic such as indicated by the broken line curve $b$ in FIG. 4 can be obtained. Thus, even where the input signal level varies over a wide range, since the duty ratio of the output signal remains constant, the fundamental wave component of the output signal also becomes constant. Therefore, the invention is extremely advantageous in a multi-frequency signal receiver or the like.

Figure 5:
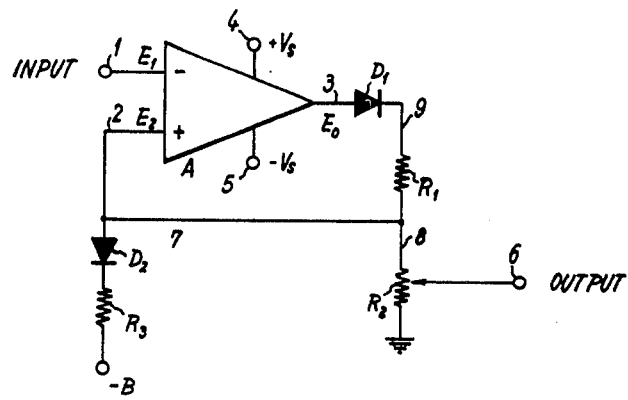
FIG. 5 is a circuit diagram illustrating another example of this invention.
Figure 6:
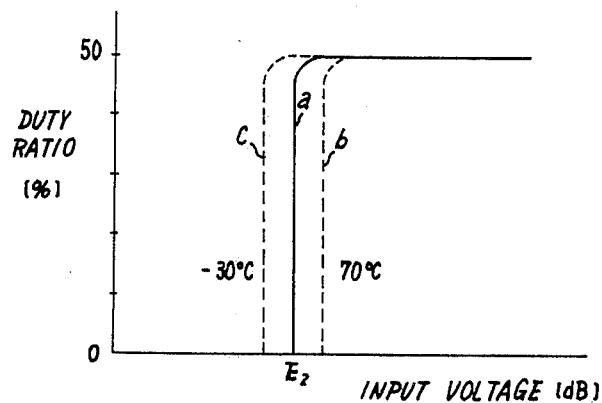
FIG. 6 shows characteristic curves illustrating the relationship between an input voltage and the duty ratio of a limited output signal in case of deviation of temperature.

Turning now to FIGS. 5 and 6, the second embodiment of this invention will be described. However, in FIG. 5, since parts corresponding to those in FIGS. 1 and 3 are indicated by the same reference numerals and characters, no description will be given. As is apparent from FIG. 5, the limiter of the present embodiment has a diode $D_2$ added to the limiter of the first embodiment. Namely, the diode $D_2$ is inserted in the forward direction of the negative bias current in the bias voltage set circuit. With such further connection of the diode $D_2$, it is possible to prevent the threshold level of the limiter from changing with temperature deviations. This will hereinbelow be described in detail. Assuming that the diode $D_2$ is not provided and that ambient temperature rises from 20° to 70° C, the threshold voltage of the diode $D_1$ changes to reduce a voltage drop thereacross. Accordingly, the amount of positive feedback to the second input terminal 2 varies so that the threshold level of the input signal changes from the solid line curve $a$ to the broken line curve $b$ in FIG. 6. Further, if ambient temperature changes from 20° C to $-30°$ C, the threshold voltage of the diode $D_1$ rises and the amount of positive feedback to the second input terminal 2 decreases, so that the threshold level of the input signal changes from the solid line curve $a$ to the broken line $c$ in FIG. 6. Consequently, the circuit shown in FIG. 3 is very advantageous in that even if the input signal varies over a wide level range, an output having a stable duty ratio of 50% can be obtained but is deficient in that the threshold level of the limiter varies with ambient temperature. On the other hand, by the provision of the diode $D_2$ in the bias voltage set circuit as in the present embodiment shown in FIG. 5, even if ambient temperature rises to lower the threshold voltage of the diode $D_1$, the threshold voltage of the second diode $D_2$ also lowers at the same time and, as a result of this, an increase in the amount of positive feedback can be cancelled by an increase in the negative bias voltage fed from the negative bias power terminal $-B$. Further, also in the case of temperature lowering, similar compensation can be effected. Consequently, the threshold level of the limiter does not vary with temperature change, thus making it possible to obtain a rectangular output which is amplitude-limited at a constant level.

Although the embodiments of this invention has been described, the invention is not limited specifically thereto but may be further modified. For example, it is possible to add other various circuits. Further, it is also possible to modify the feedback circuit, the output circuit, etc.

What I claim:
1. A limiter comprising:
   A differential amplifier having at least a first input terminal receptive of an input AC signal, a second input terminal, an output terminal for providing an output signal proportional to a difference between voltages respectively applied to said first input terminal and said second input terminal, a positive power source terminal receptive in use of a positive source voltage having a level which determines the positive level limit of the differential amplifier output signal, and a negative power source terminal;
   a feedback circuit connected between said output terminal of said differential amplifier and said second input terminal so that the output voltage derived from the output terminal of said differential amplifier is positively fed back to said second input terminal;

an output circuit connected to said feedback circuit for deriving therefrom an amplitude-limited output signal;

said feedback circuit including a rectifier element connected between said output terminal and said output circuit and having a polarity effective to pass positive portions of the differential amplifier output signal to said output circuit; and a bias voltage set circuit connected to said second input terminal for applying a negative bias voltage to said second input terminal and to limit conduction of said diode when the differential amplifier output signal is less than a certain value determined by the negative bias voltage, thereby to limit the negative level of the output signal.

2. A limiter comprising:

a differential amplifier having at least a first input terminal receptive of an input AC signal, a second input terminal, an output terminal for providing an output signal proportional to a difference between voltages respectively applied to said first input terminal and said second input terminal, a positive power source terminal in use of a positive source voltage having a level which determines the positive level limit of the differential amplifier output signal, and a negative power source terminal;

a feedback circuit connected between said output terminal of said differential amplifier and said second input terminal so that the output voltage derived from the output terminal of said differential amplifier is positively fed back to said second input terminal;

an output circuit connected to said feedback circuit for deriving therefrom an amplitude output signal;

said feedback circuit including a first rectifier element connected between said output terminal and said output circuit and having a polarity effective to pass positive portions of the differential amplifier output signal to said output circuit; and a bias voltage set circuit connected to said second input terminal for applying a negative bias voltage to said second input terminal and to limit conduction of said diode when the differential amplifier output signal is less than a certain value determined by the negative bias voltage thereby to limit the negative level of the output signal, and wherein said bias voltage set circuit includes a second rectifier element inserted in said bias voltage set circuit in the direction of the bias current of said bias voltage set circuit to provide a conductive path for the bias current.

3. A limiter according to claim 2, wherein said first and second rectifier elements have substantially the same temperature characteristics.

* * * * *